PRE-SET TUNER

Filed Oct. 20, 1961

INVENTORS
EDWARD A. STEWART
JOHN T. HARTEN

BY James and Franklin

ATTORNEYS

INVENTORS
EDWARD A. STEWART
JOHN T. HARTEN
BY
James and Franklin
ATTORNEYS

PRE-SET TUNER

Filed Oct. 20, 1961 3 Sheets-Sheet 3

INVENTORS
EDWARD A. STEWART
JOHN T. HARTEN

BY James and Franklin

ATTORNEYS

United States Patent Office
3,236,109
Patented Feb. 22, 1966

3,236,109
PRE-SET TUNER
Edward A. Stewart, Chicopee Falls, and John T. Harten, Long Meadow, Mass., assignors to General Instrument Corporation, Newark, N.J., a corporation of New Jersey
Filed Oct. 20, 1961, Ser. No. 149,805
5 Claims. (Cl. 74—10)

The present invention relates to a multi-channel tuner such as may be employed in a television receiving set, in which means are provided for adjustably pre-setting the tuning elements for the individual channels to be received.

It is common in television receiving set tuning devices to utilize a plurality of individually adjustable tuning elements, one for each channel, the selection of the particular tuning element and its insertion into the tuning circuit providing for channel selection (coarse tuning), the individual adjustment of the thus-selected tuning elements providing for optimum reception of a given channel (fine tuning). In many types of tuners a selected tuning element must be fine tuned for optimum reception each time that it is selected. Having to perform fine tuning operations each time that a channel is changed is troublesome and time consuming. Accordingly it has been proposed that the individual tuning elements be preset for what is believed to be optimum tuning conditions, those elements retaining that setting and being readjusted only when necessary. This has represented a substantial advance in ease and simplicity of tuning, a matter of considerable importance in connection with home television reception, where the set is operated in most instances by persons of limited mechanical or scientific ability.

Despite the advantages of pre-setting, widespread adoption of this type of tuning apparatus has lagged, to a large extent because of the difficulty experienced in providing means for adjusting the individual tuning elements which (a) can be readily and conveniently manipulated by the user of the set, (b) can be readily assembled, (c) is composed of a plurality of simple parts which need not be made to any particular degree of dimensional precision, and (d) will function reliably over a long period of time. Thus, in prior known structures of the type under discussion, when adjustment of a given tuning element was desired, a complex movement of the manual control thereof was required. That control, usually in the form of a knob attached to a shaft, had to be pushed in to bring a part operatively connected thereto into engagement with the selected tuning element, and then, while retained in that pushed-in position, rotated to accomplish the desired adjustment. Not only were two types of motions—translation and rotation—required, but the rotation had to be accomplished while the knob was pushed in all the way. Not only was this sometimes difficult to do but there is a tendency, when the knob is rotated, for it to be unconsciously released from its pushed-in position, with the result that no adjustment of the tuning element takes place even though the operator rotates the knob and thinks that he is making an adjustment.

The prime object of the present invention is to devise a construction which will eliminate these disadvantages. More specifically, the structure of the present invention provides for adjustment of a selected one of a plurality of individually adjustable tuning elements through the manual manipulation of a single control element in but a single sense, such as rotation. Rotation of the control element first causes operative engagement of the adjustment means with the selected tuning element and then actuates that adjusting means to cause adjustment of the tuning element. This operative engagement, followed by adjustment, occurs whether the manual control is actuated in one direction or another to increase or decrease the effective electrical parameter of the selected tuning element. This is accomplished by means of simple, sturdy and reliable mechanism.

The individual tuning elements are carried by a movably mounted body, which, as it is moved, sequentially brings the tuning elements to an adjusting station, as is conventional. This corresponds to coarse tuning or channel selection. A tuning-element-engaging means is movably mounted adjacent the adjusting station for movement between positions in which it is respectively operatively engaged with and operatively disconnected from the individual tuning element at the station. This means may take the form of a rotation-transmitting element such as a gear movable into and out of operative engagement with a cooperating element (gear) secured to the tuning element in question. The rotation-transmitting element is normally out of engagement with the tuning element, thus permitting the body which carries the tuning elements to be freely moved to bring one or another of the tuning elements carried thereby to the adjusting station. A manual control means such as a rotatable knob is operatively connected to the tuning-element-engagement means and is adapted to be moved in a single sense (e.g., rotation). When it is thus moved it first moves the tuning-element-engaging means into engagement with the tuning element, this usually involving a translatory movement thereof, and then rotates it so as to adjust the setting of the tuning element engaged thereby. Thus, the movement of the manual control means in but a single sense is converted by appropriate mechanism into movement of the tuning-element-engaging means in two different senses, e.g., a translatory movement to bring it into operative engagement with the tuning element and a rotary movement to accomplish the desired adjustment function.

In the form here specifically disclosed the tuning-element-engaging means comprises a gear rotatably mounted on a carrier, the carrier in turn being slidably mounted on the tuner support. The manual control means comprises a shaft on which a gear and a cam are mounted. The carrier is normally in an inoperative position in which the gear carried thereby is not only operatively spaced from the tuning element at the adjusting station but is also operatively spaced from the gear on the manual control shaft. The cam is in operative engagement with the carrier, and is effective, when the control shaft is rotated, to move that carrier so as to bring the gear mounted thereon into engagement with the tuning element at the adjusting station. In the preferred form here specifically illustrated it also moves that gear into operative engagement with the gear on the control shaft. Once these operative engagements have been effected, continued rotation of the control shaft causes the carrier-mounted gear to rotate, and thus produces adjustment of the selected tuning element at the adjusting station. When rotative pressure on the control shaft is released, the carrier moves away from the adjusting station, the gear mounted thereon disengages itself from the tuning element at that station (and from operative engagement with the gear on the control shaft), and the body which carries the tuning elements is left free for movement to bring a different tuning element to the adjusting station and into the tuning circuit.

To the accomplishment of the above, and to such other objects as may hereinafter appear, the present invention relates to a tuning assembly providing for pre-setting of a plurality of individually selectable tuning elements, as defined in the appended claims, and as described in this specification, taken together with the accompanying drawings in which:

Figure 1:
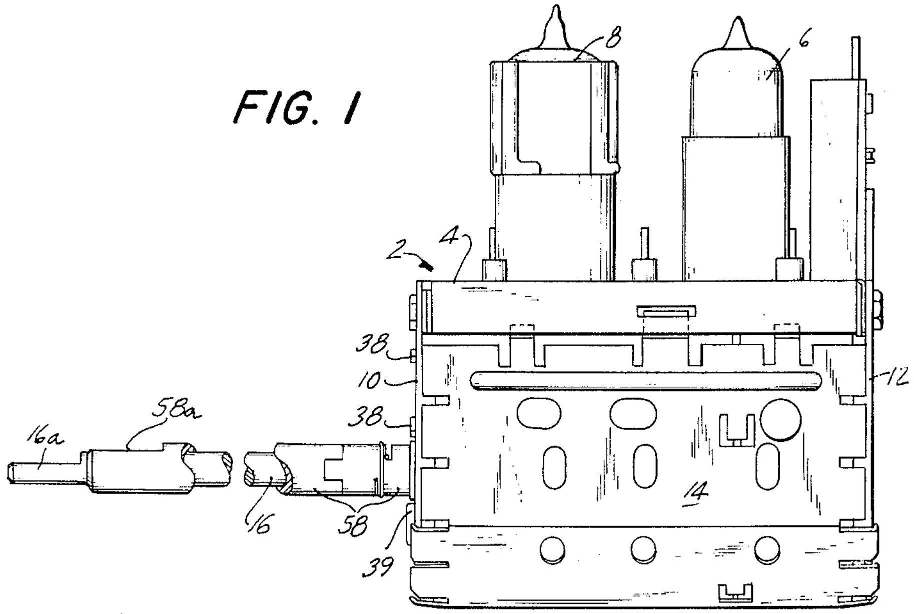
FIG. 1 is a side elevational view of a typical television set tuner embodying the present invention.
Figures 2, 3:
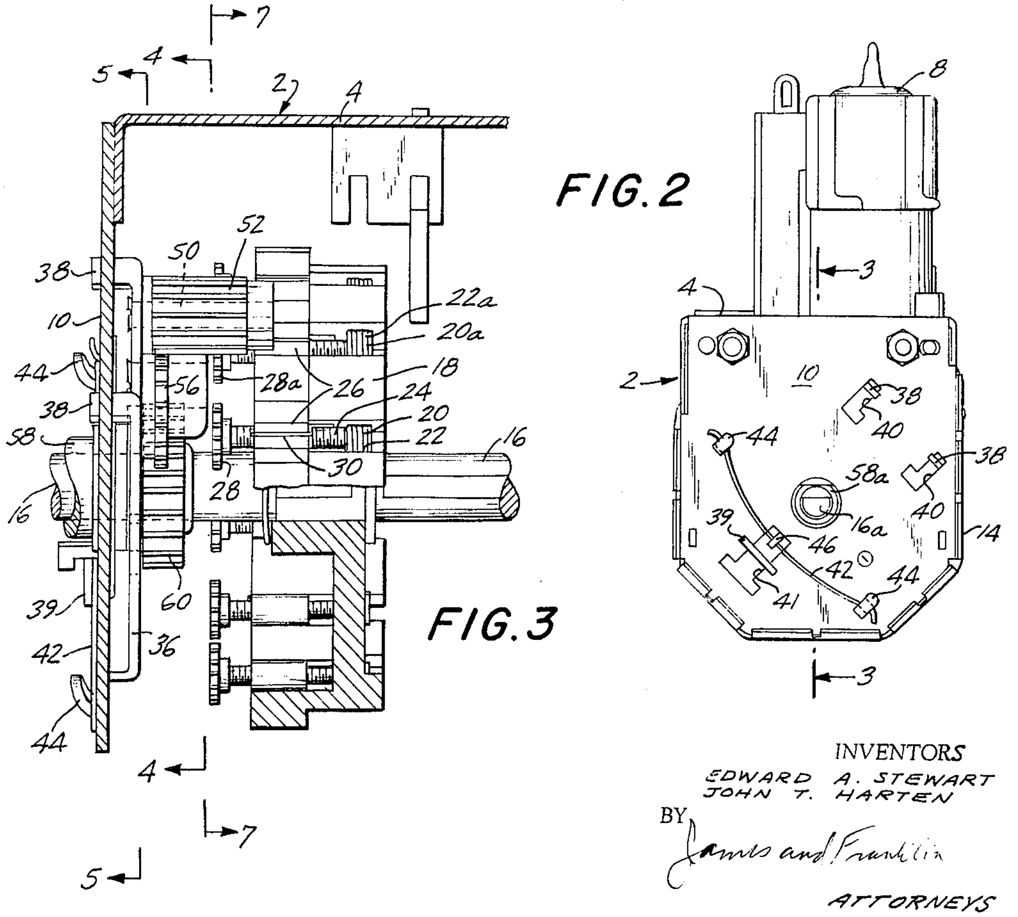
FIG. 2 is an end elevational view thereof taken from the left-hand side of FIG. 1.
FIG. 3 is a fragmentary cross sectional view on an enlarged scale, taken along the line 3—3 of FIG. 2.
Figure 7:
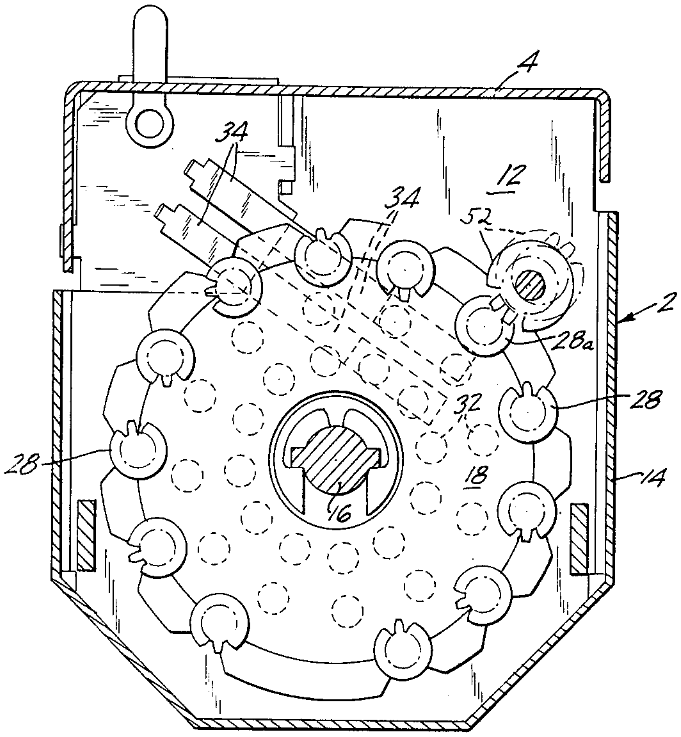
FIG. 7 is a cross sectional view taken along the line 7—7 of FIG. 3.
Figure 8:
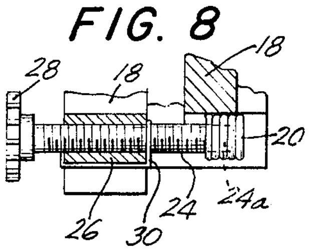
FIG. 8 is a cross sectional view showing details of the construction of an individual tuning element and its adjusting core.

The tuning assembly comprises a housing generally designated 2 having a top wall 4 on which various electrical elements, such as the vacuum tubes 6 and 8, together with other circuit elements, are adapted to be mounted. The housing 2 is further provided with end walls 10 and 12 and with a removable cover 14. A channel selector shaft 16 is journalled in the end wall 10, and extends forwardly therefrom to terminate in an end 16*a* to which a channel selector knob (not shown) may be secured, and within the housing 2 provides for selection in any appropriate manner, as through a wafer switch or turret construction, for the connection into the tuning circuit of appropriately designed circuit elements such as inductances or capacitors. As here specifically disclosed there is mounted on the shaft 16, within the housing 2, a turret-like body 18 formed of appropriate insulating material which carries, peripherally spaced thereabout, a plurality of individual tuning coils 20. These coils are adapted to be secured in any appropriate manner, as by means of a suitable adhesive, in recesses 22 formed in the body 18 (see FIG. 3). The inductance of each coil 20 is adapted to be adjusted in known permeability tuning manner by means of a core axially movable therewithin, that core being defined by the tip 24*a* of a screw 24 which passes through bushing 26 forming a part of the body 18, extends out forwardly therefrom, and carries a gear 28 on its forwardly extending tip. Threaded drive with the screw 24 is achieved in any appropriate manner, as by means of the spring wire 30 secured to the bushing 26 and engaging the external thread of the screw 24 (see FIG. 8). The ends of each of the coils 20 are electrically connected to contact buttons 32 carried by the body 18 (see FIG. 7). Rotation of the shaft 16 moves the body 18 so that a selected pair of contact buttons 32 corresponding to an individual tuning coil 20 are brought into engagement with contact springs 34 fixedly mounted on the housing 2 and appropriately electrically connected to the overall tuning circuit, thereby bringing into the tuning circuit the individual coil 20 corresponding to the contact buttons 32 which engage the springs 34. It will be apparent that the inductances of the individual coils 20 should correspond to the circuit values required for the optimum reception of signals from different television channels, and it will further be apparent that the inductances of these coils 20 can be adjusted within limits by varying the degree to which they are penetrated by the tips 24*a* of their respectiving tuning screws 24.

Since the contact springs 34 are fixed to the support 2 the particular one of the coils 20 which is in the tuning circuit at any given time will always be in the same location relative to the support 2. That location is hereinafter termed its "adjusting station," and the coil at that station and its gear are designated 20*a* and 28*a* respectively.

Means are provided for varying the inductance of the particular coil 20*a* operatively effective in the tuning device while it remains at the adjusting station by rotating its adjusting screw 24 via the gear 28*a*. As here specifically disclosed a carrier plate 36 is mounted on the inside of the support end wall 10 by lugs 38 and 39 received within the slots 40 and 41 respectively in the end wall 10, for movement parallel to that end wall. A spring 42 is mounted on the exterior of the end wall 10, its ends are engaged with anchor tabs 44 struck out from the end wall 10, and its tensioned body engages finger 46 forming a part of the carrier plate 36 and extending out through the slot 41. The spring 42 thus biases the plate 36 upwardly, the plate 36 being moved downwardly against the action of the spring 42, as indicated by the double-headed arrow 48 in FIGS. 5 and 6, the length of the slots 40 and 41 permitting this movement.

Figure 4:
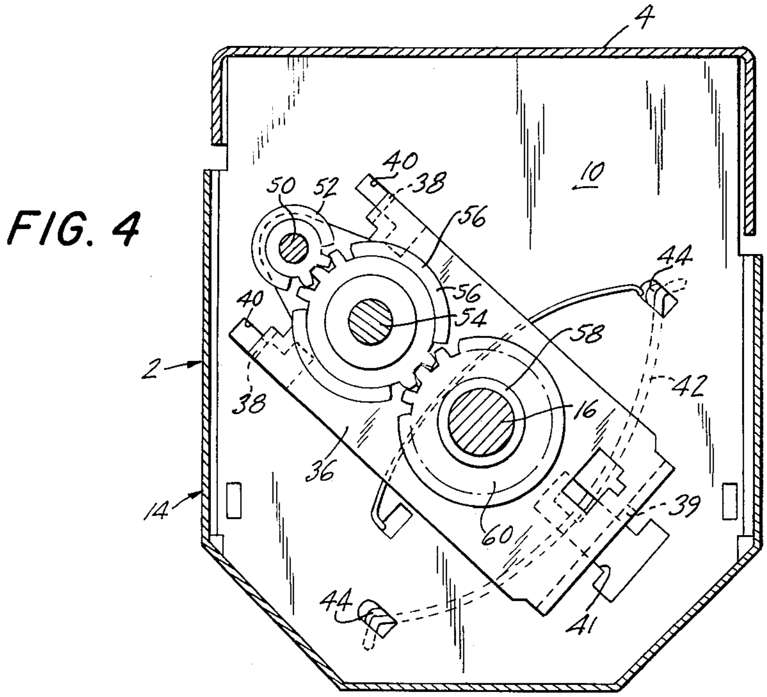
FIG. 4 is a cross sectional view taken along the line 4—4 of FIG. 3 and showing the position which the parts assume while the manual control shaft is being rotated.
Figure 5:
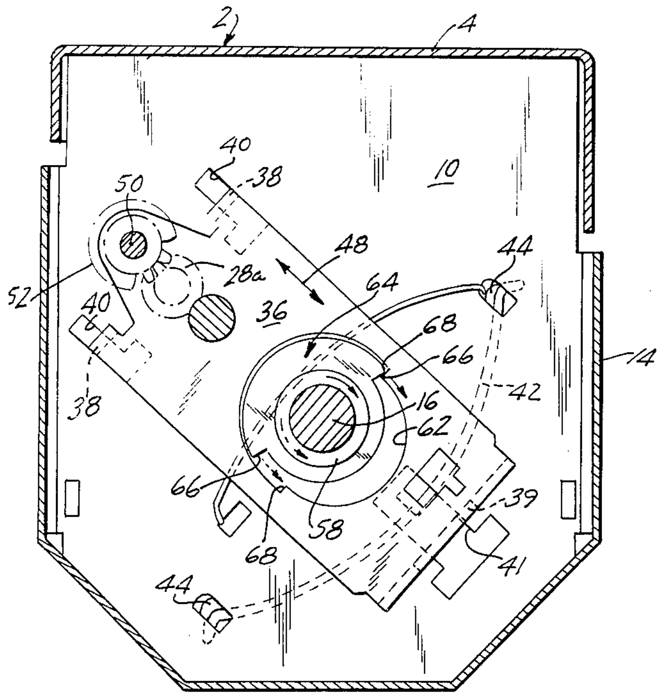
FIG. 5 is a cross sectional view similar to FIG. 4 but taken along the line 5—5 of FIG. 3.
Figure 6:
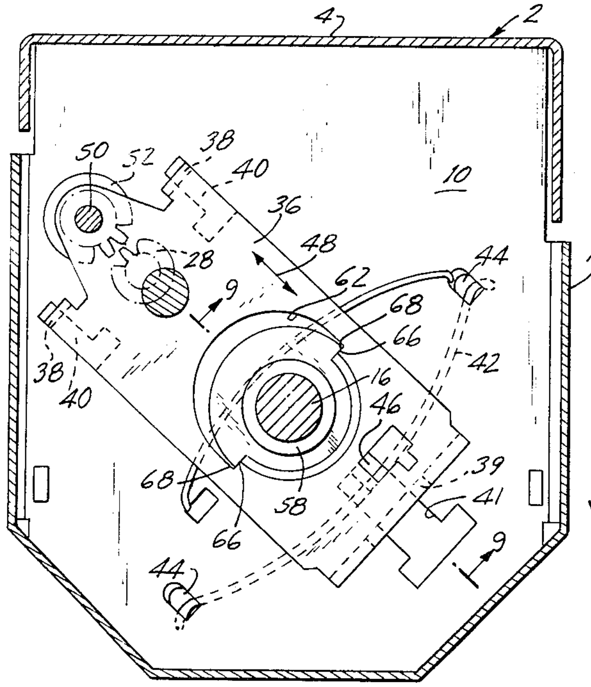
FIG. 6 is a view similar to FIG. 5 but showing the parts in their position when the control shaft is not rotated.
Figure 9:
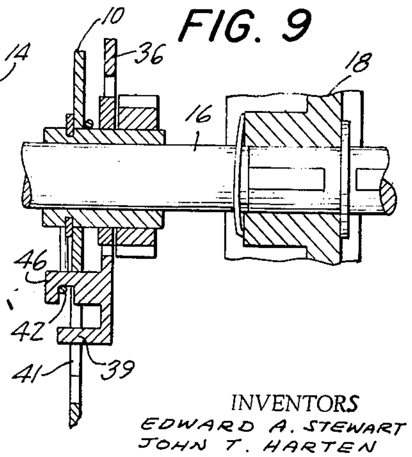
FIG. 9 is a cross sectional view taken along the line 9—9 of FIG. 6.

Mounted on the upper end of the carrier plate 36 for rotation about stud 50 is gear 52. Also mounted on the carrier plate 36 for rotation about stud 54 is gear 56 which meshes with the gear 52 (see FIG. 4). The gear 52 extends outwardly from the carrier plate 36 to a position axially beyond and radially out from the gear 28*a* on the tuning screw 24 corresponding to the particular coil 20*a* in the adjusting station at any given time. When the carrier plate 36 is in its upper position, as shown in FIG. 6, the gear 52 is separated from the appropriate gear 28, but when the carrier plate 36 is moved downwardly as shown in FIGS. 4 and 5, the gear 52 is moved into mesh with the appropriate gear 28*a*.

A fine tuning or adjustment shaft 58 is mounted on the front end wall 10 concentrically with the shaft 16, and extends forwardly therefrom so that its end 58*a* may have a control knob (not shown) mounted thereon. The shaft 58 extends inwardly from the end wall 10 and has a gear 60 rotationally fixed thereto and located axially inwardly of the carrier plate 36. This gear 60 is in line with the gear 56 on the carrier plate 36, the gears 56 and 60 being out of operative engagement when the carrier plate 36 is in its upper position shown in FIG. 6, and the gears 56 and 60 meshing when the carrier plate 36 is in its lower position (see FIG. 4).

The shaft 58 passes through an opening 62 in the carrier plate 36 and there carries a cam 64 which is frictionally rotationally connected thereto in any appropriate manner, that cam 64 having a pair of oppositely disposed shoulders 66 thereon. The opening 62 in the carrier plate 36 freely receives the cam 64, and is provided with shoulders 68 corresponding to and engaging with the cam shoulders 66. When the carrier plate 36 is in its upper position both of its shoulders 68 engage with both of the shoulders 66 on the cam 64, that cam 64 and the shaft 58 to which it is connected assuming a predetermined rotational position. When the adjustment shaft 58 is rotated from this position, one or the other of the cam shoulders 66 (depending upon the direction of rotation of the shaft 58) will push the corresponding carrier plate shoulder 68 down, thus forcing the carrier plate 36 downwardly against the action of the spring 42. This movement will continue until (a) the gear 56 on the carrier plate 36 meshes with the gear 60 on the shaft 58, and (b) the gear 52 on the carrier plate 36 meshes with the adjustment gear 28*a* for the selected tuning coil 20*a* at the adjusting station. Once this occurs the carrier plate 36 cannot move downwardly any further, and continued rotation of the shaft 58 causes the cam 64 to slip relative thereto. That further rotation of the shaft 58, however, causes rotation of the gear 60 and thus, via the gears 56 and 52, causes rotation of the engaged adjustment gear 28*a*. This in turn causes the tuning screw 24 to move inwardly or outwardly relative to its coil 20*a* (depending upon the direction of rotation of the shaft 58), thus changing the inductance of the coil 20 and producing a fine tuning effect.

Once the desired fine tuning has been accomplished the shaft 58 is released, the spring 42 will urge the carrier plate 36 upwardly until both of its shoulders 68 engage with the corresponding cam shoulders 66, the gear 56 will become unmeshed from the gear 60, and the gear 52 will become unmeshed from the gear 28. Since the gear 52, in this position, is located radially outwardly from the adjusting station, the body 18 which carries the tuning coils 20 is thus rendered free for channel selection rotation through actuation of the shaft 16 without disturbing the setting of the previously adjusted tuning screw 24 and without any type of physical interference with the mechanism for producing that adjustment, said mechanism being at this point in an inoperative and ineffective position.

As different channels are selected, different coils 20 are brought to the adjusting station and connected into the tuning circuit via the contact springs 34. Each of these coils 20 and associated tuning screws 24 retain the adjusted condition which they previously had, and if the signal reception is satisfactory, nothing further need be done. If, however, some further fine tuning adjustment seems required, all the operator need do is rotate the shaft 58, that rotation, through the action of the cam 64, first bringing the gear train 56, 52 into operative connection between the shaft 58 and the appropriate tuning screw 24 by means of a translatory motion (the downward movement of the carrier plate 36 and the gears 56 and 52 carried thereby), continued rotation of the shaft 58 then producing adjustment of the axial position of the tuning screw 24 by rotating that screw 24.

Only a single type of manual manipulation—rotary movement as here specifically disclosed—is required to bring the adjusting parts into operative engagement and effect the desired adjustment. Once the rotary force is released, the adjusting interconnection is automatically broken and the parts automatically assume a position permitting coarse tuning (channel selection), with the individual tuning elements retaining the adjustments to which they have been previously subjected.

The parts involved are simple and sturdy, and require no high degree of precision in manufacture. The nature of the connection is positive and reliable. The parts may be readily manufactured and assembled on a mass production basis, so that the cost of the assembly is minimal.

While but a single embodiment of the invention has been here specifically disclosed it will be apparent that many variations may be made therein all within the scope of the instant invention as defined in the following claims.

We claim:

1. In a tuning assembly comprising a body, a plurality of individual adjustable tuning elements on said body, a support means for movably mounting said body on said support for bringing said tuning elements sequentially to a given station, and adjusting means adjacent a given station on said support for engaging a tuning element at said station and adjusting it; the improvement which comprises said adjusting means comprising first means normally disengaged from the tuning element at said station but movable into engagement therewith, and thereafter further movable to adjust said tuning element, second means operatively connected to said first means for moving it into engagement with the tuning element, and third means normally disengaged from said first means and effective, when engaged therewith, to further move said first means to adjust said tuning element, said first means being movable into engagement with said third means substantially at the same time said first means moves into engagement with said tuning element, and a manual control means operatively connected to said second and third means and effective to actuate both of them upon manual movement of said control means in only a single sense.

2. The tuning assembly of claim 1, in which said first means moves with translatory motion into engagement with said tuning element and said third means and moves with rotary motion to adjust said tuning element.

3. The tuning assembly of claim 1, in which said first means moves with translatory motion into engagement with said tuning element and said third means and moves with rotary motion to adjust said tuning element, and said manual control means operatively connected to said second and third means moves only with rotary motion.

4. A tuning assembly comprising a support, a body movably mounted thereon and carrying a plurality of individually rotatably adjustable tuning elements, a selector shaft operatively connected to said body for moving it so as to sequentially bring said tuning elements to an adjusting station, a carrier mounted on said support adjacent said station and movable toward and away from said station, a first rotary member on said carrier, operatively engageable with a tuning element at said station when said carrier is moved toward said station and operatively disconnected therefrom when said carrier moves away from said station, an adjustment shaft rotatably mounted on said support, a cam on and rotatable with said adjustment shaft and operatively connected to said carrier for moving it toward said station when said adjustment shaft is rotated, and a second rotary member on and rotatable with said adjustment shaft, operatively disengaged from said first rotary member when said carrier moves away from said station and operatively engaged with said first rotary member when said carrier is moved toward said station, said second rotary member, when operatively engaged with said first rotary member, being operatively connected to said first rotary member for rotating it upon rotation of said adjustment shaft.

5. A tuning assembly comprising a support, a body movably mounted thereon and carrying a plurality of individually rotatably adjustable tuning elements, a selector shaft operatively connected to said body for moving it so as to sequentially bring said tuning elements to an adjusting station, a carrier mounted on said support adjacent said station and rectilinearly movable toward and away from said station, a first rotary member on said carrier, operatively engageable with a tuning element at said station when said carrier is moved toward said station and operatively disconnected therefrom when said carrier moves away from said station, means operatively connected to said carrier for biasing it away from said station, an adjustment shaft rotatably mounted on said support, a cam on and rotatable with said adjustment shaft and operatively connected to said carrier for moving it toward said station when said adjustment shaft is rotated, and a second rotary member on and rotatable with said adjustment shaft, operatively disengaged from said first rotary member when said carrier moves away from said station and operatively engaged with said first rotary member when said carrier is moved toward said station, said second rotary member, when operatively engaged with said first rotary member, being operatively connected to said first rotary member for rotating it upon rotation of said adjustment shaft.

References Cited by the Examiner

UNITED STATES PATENTS

| | | | |
|---|---|---|---|
| 3,022,674 | 2/1962 | Cross et al. | 74—10.85 |
| 3,058,075 | 10/1962 | Polley | 334—51 |

DAVID J. WILLIAMOWSKY, *Primary Examiner.*

DON A. WAITE, *Examiner.*

T. C. PERRY, *Assistant Examiner.*